(12) United States Patent
AbuGhazaleh et al.

(10) Patent No.: US 11,626,698 B2
(45) Date of Patent: *Apr. 11, 2023

(54) POWER CONNECTOR WITH INTEGRATED POWER MONITORING

(71) Applicant: Hubbell Incorporated, Shelton, CT (US)

(72) Inventors: Shadi Alex AbuGhazaleh, Guilford, CT (US); Ryan Gene Papageorge, Shelton, CT (US); Thomas Louis Scanzillo, Monroe, CT (US)

(73) Assignee: Hubbell Incorporated, Shelton, CT (US)

(*) Notice: Subject to any disclaimer, the term of this patent is extended or adjusted under 35 U.S.C. 154(b) by 191 days.

This patent is subject to a terminal disclaimer.

(21) Appl. No.: 17/123,567

(22) Filed: Dec. 16, 2020

(65) Prior Publication Data

US 2021/0104846 A1 Apr. 8, 2021

Related U.S. Application Data

(63) Continuation of application No. 16/423,542, filed on May 28, 2019, now Pat. No. 10,873,163, which is a
(Continued)

(51) Int. Cl.
*H01H 47/00* (2006.01)
*H01R 13/66* (2006.01)
(Continued)

(52) U.S. Cl.
CPC ......... *H01R 13/6683* (2013.01); *G01K 7/023* (2013.01); *G01R 19/003* (2013.01);
(Continued)

(58) Field of Classification Search
CPC ....... H01H 9/061; H01H 11/0062; H02J 9/06; H02J 13/0041; H02H 9/001
See application file for complete search history.

(56) References Cited

U.S. PATENT DOCUMENTS

| 4,652,975 A | 3/1987 | Scott |
| 6,049,143 A | 4/2000 | Simpson |

(Continued)

FOREIGN PATENT DOCUMENTS

| CN | 1972024 | 5/2007 |
| CN | 201663318 | 12/2010 |

(Continued)

OTHER PUBLICATIONS

PCT /US2017 /032193 International Search Report and Written Opinion dated Sep. 22, 2017 (33 pages).
(Continued)

*Primary Examiner* — Phuong Chi Thi Nguyen
(74) *Attorney, Agent, or Firm* — Michael Best & Friedrich LLP

(57) ABSTRACT

An electronic power connector including a contact configured to electrically connect a power supply to a load. The electronic power connector further including a contact core configured to receive the contact, the contact core including a transformer winding wrapped around the contact core, the transformer winding configured to sense a current.

20 Claims, 10 Drawing Sheets

Related U.S. Application Data continuation of application No. 15/592,927, filed on May 11, 2017, now Pat. No. 10,305,230.

(60) Provisional application No. 62/334,872, filed on May 11, 2016.

(51) Int. Cl.
| | | |
|---|---|---|
| *H01F 38/30* | (2006.01) | |
| *G01R 21/06* | (2006.01) | |
| *G01K 7/02* | (2021.01) | |
| *G01R 19/00* | (2006.01) | |
| *H01F 38/38* | (2006.01) | |
| *H01R 4/36* | (2006.01) | |
| *H01R 24/20* | (2011.01) | |
| *G01K 7/30* | (2006.01) | |
| *G01K 7/16* | (2006.01) | |
| *G01R 19/145* | (2006.01) | |
| *H01F 27/40* | (2006.01) | |
| *H01R 13/02* | (2006.01) | |

(52) U.S. Cl.
CPC .............. *G01R 21/06* (2013.01); *H01F 38/30* (2013.01); *G01K 7/30* (2013.01); *G01K 2007/163* (2013.01); *G01R 19/145* (2013.01); *H01F 27/402* (2013.01); *H01F 38/38* (2013.01); *H01F 2027/406* (2013.01); *H01R 4/36* (2013.01); *H01R 13/025* (2013.01); *H01R 24/20* (2013.01)

(56) References Cited

U.S. PATENT DOCUMENTS

| | | |
|---|---|---|
| 6,215,203 B1 | 4/2001 | Wood |
| 6,947,287 B1 | 9/2005 | Zansky et al. |
| 8,339,810 B2 | 12/2012 | Ratnaparkhi et al. |
| 10,305,230 B2 * | 5/2019 | AbuGhazaleh ...... G01R 19/003 |
| 10,873,163 B2 * | 12/2020 | AbuGhazaleh .... H01R 13/6683 |
| 2002/0064983 A1 | 5/2002 | Patey |
| 2009/0081902 A1 | 3/2009 | Montena et al. |
| 2012/0206229 A1 | 8/2012 | Casper et al. |
| 2017/0331233 A1 | 11/2017 | Abughazaleh et al. |

FOREIGN PATENT DOCUMENTS

| | | |
|---|---|---|
| CN | 202210141 | 5/2012 |
| CN | 102636677 | 8/2012 |
| CN | 203561449 | 4/2014 |
| CN | 104115358 | 10/2014 |
| CN | 104170179 | 11/2014 |

OTHER PUBLICATIONS

Chinese Application No. 201780028889.6 Second Office Action issued by the China National Intellectual Property Administration and translation dated Aug. 5, 2020.

Chinese Patent Application No. 201780028889.6 Fourth Office Action Issued by the China National Intellectual Proerty Administration dated Nov. 10, 2021 (and translation).

Chinese Patent Application No. 201780028889.6 Third Office Action Issued by the China National Intellectual Proerty Administration dated Apr. 27, 2021 (and translation).

\* cited by examiner

POWER CONNECTOR WITH INTEGRATED POWER MONITORING

RELATED APPLICATIONS

The present application claims priority to U.S. patent application Ser. No. 16/423,542, filed on May 28, 2019, which claims priority to U.S. patent application Ser. No. 15/592,927, filed May 11, 2017, which claims priority to U.S. Provisional Application 62/334,872, filed May 11, 2016, the entire contents both of which are hereby incorporated.

FIELD

Embodiments relate to electrical power connectors.

SUMMARY

Electrical power connectors provide a connection between a power supply and a load. Such electrical power connectors may be described in U.S. patent application Ser. No. 15/072,672, filed Mar. 17, 2016, which is hereby incorporated by reference.

Power measurements are typically used to monitor the power consumption of the equipment connected through an electrical power connector. In some cases, the ability to accurately measure the power consumption enables an operator to allocate energy costs to various users based on the usage of the equipment.

Environmental monitoring, in particular temperature, can be used to identify normal versus abnormal operating conditions. Continuous measurement enables identification of changes in operating parameters that are out of acceptable ranges so that an alert is triggered to notify the operators to the condition. In the absence of this capability, users may monitor connection temperature by regular manual scanning of the temperature. Furthermore, data analytics and understanding the normal operating parameters help provide the user with predictive, or preventive, alerts before a potential failure occurs due to environmental or installation anomalies.

In one embodiment, the application provides an electrical power connector including a contact and a contact core. The contact is configured to electrically connect a power supply to a load. The contact core is configured to receive the contact. The contact core includes a transformer winding configured to sense a current and a sensor slot configured to receive a sensor. In some embodiments, the sensor is configured to sense a temperature. In some embodiments, the sensor is configured to sense a voltage.

In another embodiment, the application provides a power connector including a sleeve and a contact carrier located within the sleeve. The contact carrier includes a contact transformer module having a connector contact, a contact core, and a transformer winding.

In yet another embodiment, the application provides a method of sensing various characteristics of an electronic power connector. The method including providing a transformer winding around a contact core; providing a sensor slot proximate the contact core, the sensor slot configured to receive a sensor; sensing, via the transformer, a current; and sensing, via the sensor, a characteristic.

Other aspects of the application will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Figure 1:
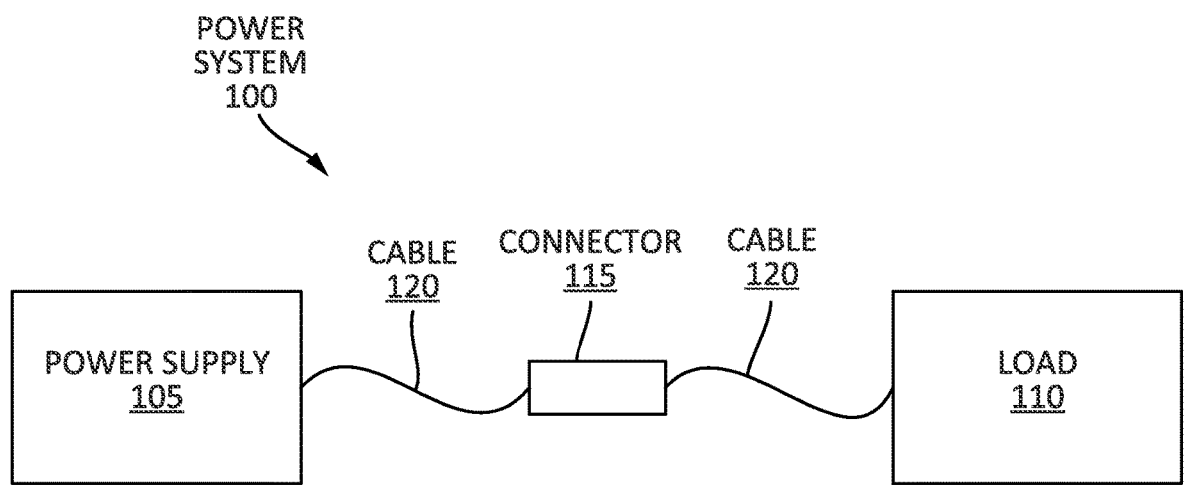
FIG. 1 is a block diagram of a power system according to one embodiment of the application.

FIG. 1 illustrates a power system 100 according to some embodiments of the application. The power system 100 includes a power supply 105, a load 110, an electrical power connector, or connector, 115, and a power supply cable 120. In some embodiments, the power supply 105 is a single-phase power supply outputting a voltage within a range of approximately 100 VAC to approximately 240 VAC. In other embodiments, the powers supply 105 is a three-phase power supply outputting a voltage within a range of approximately 208 VAC to approximately 600 VAC. The load 110 may be any electrical device or system configured to receive power.

Figure 2:
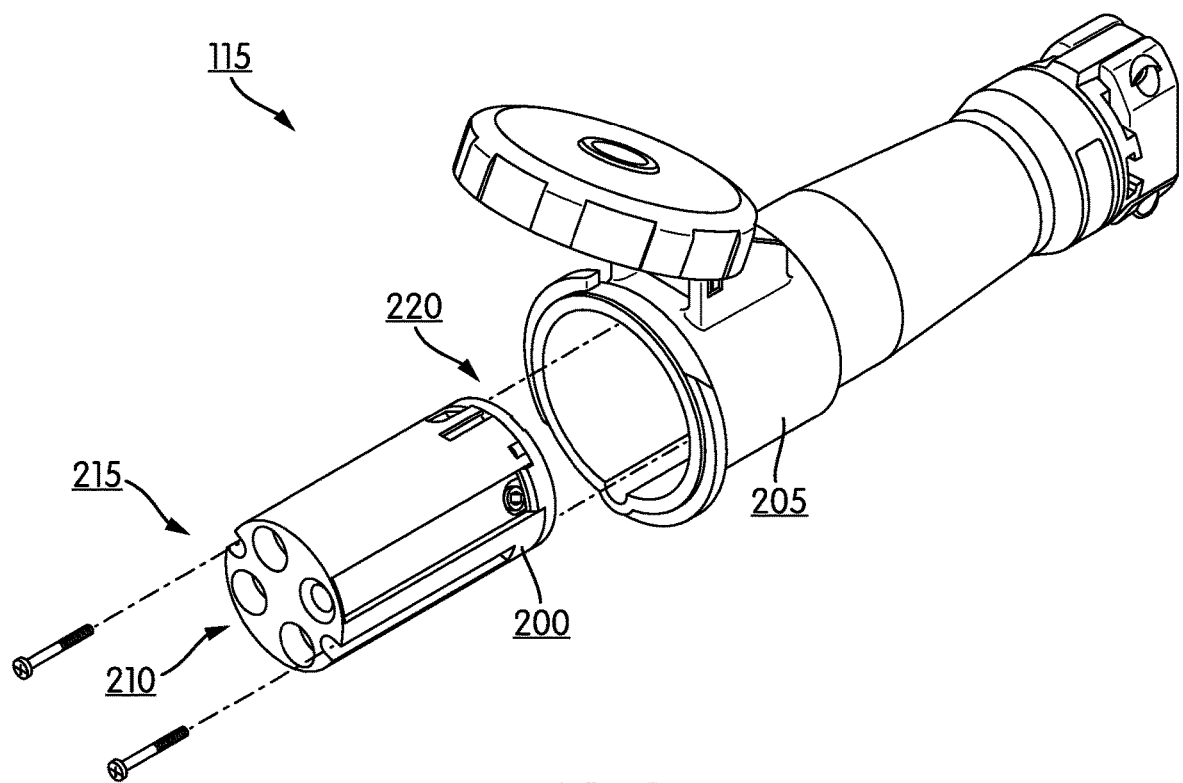
FIG. 2 is a perspective view of an electrical power connector of the power system of FIG. 1 according to some embodiments of the application.
Figure 3:
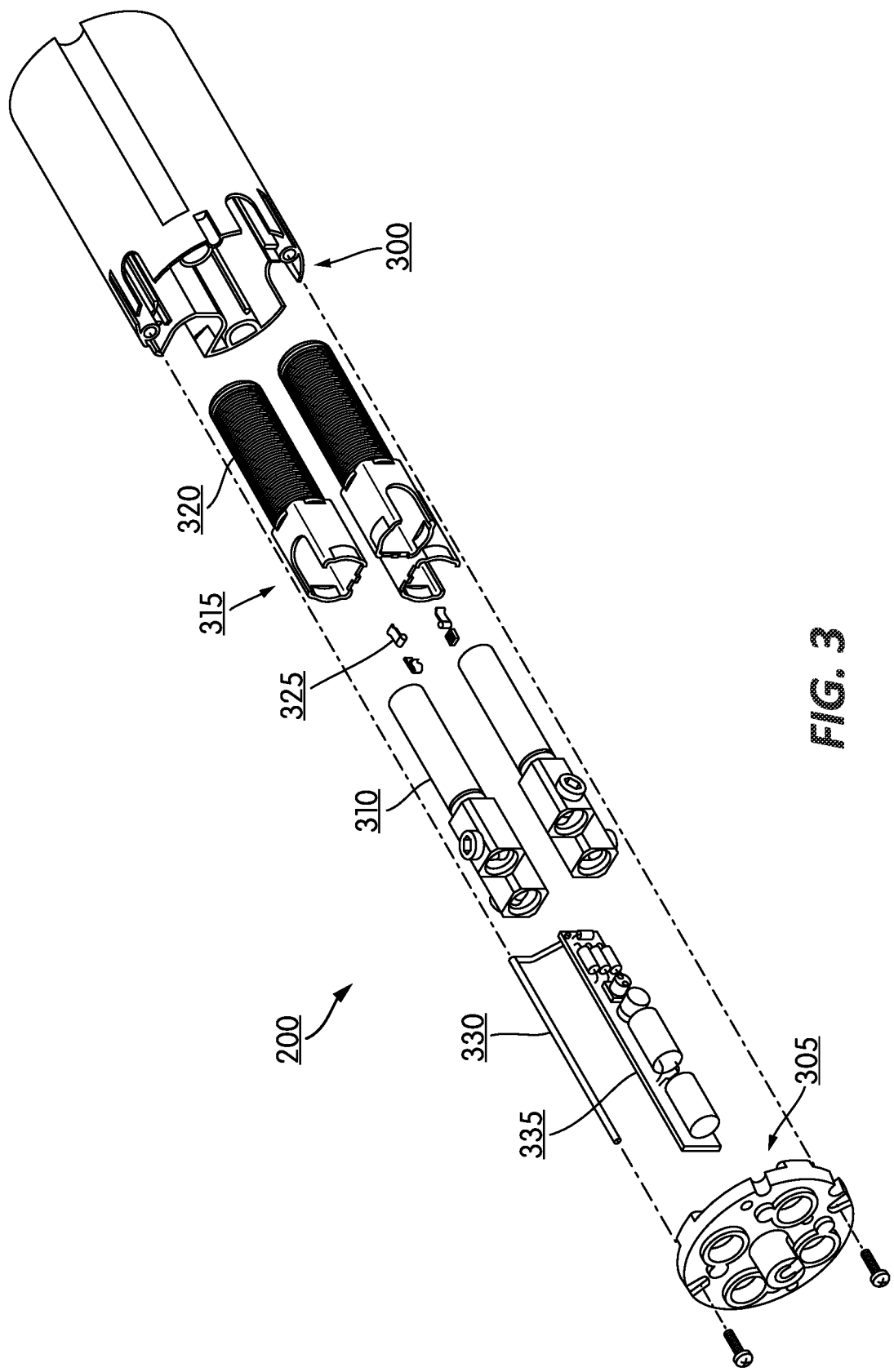
FIG. 3 is a break away view of a contact carrier of the electrical power connector of FIG. 2 according to some embodiments of the application.
Figure 5:
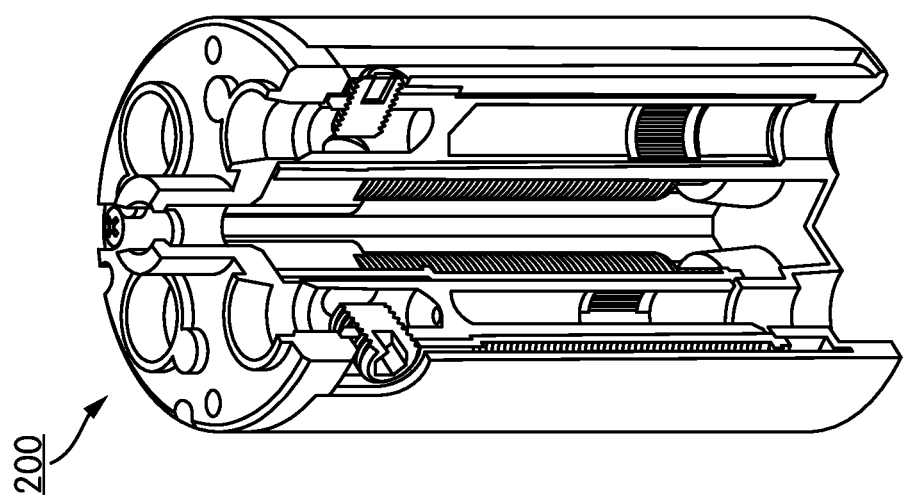
FIG. 5 is a partially exposed view of the contact carrier of FIG. 4 according to some embodiments of the application.
Figure 4:
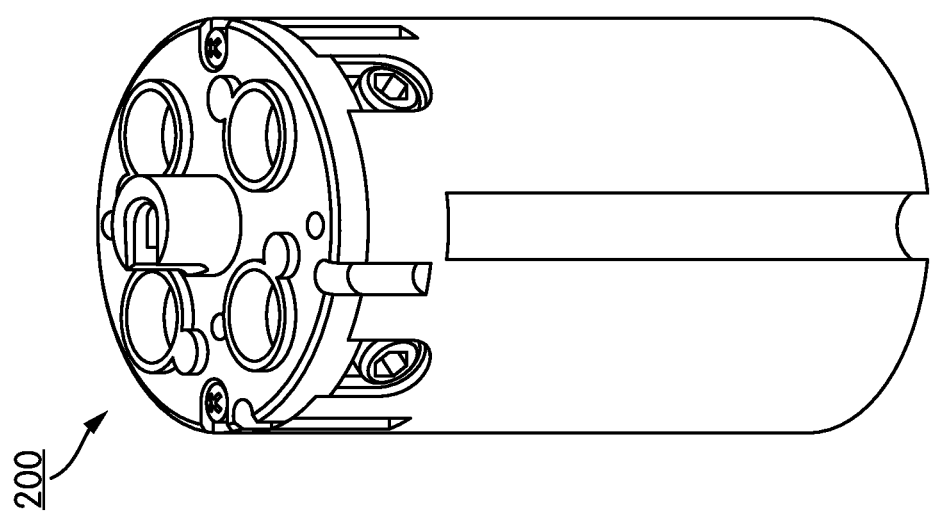
FIG. 4 is a perspective view of a contact carrier of the electrical power connector of FIG. 2 according to some embodiments of the application.
Figure 7:
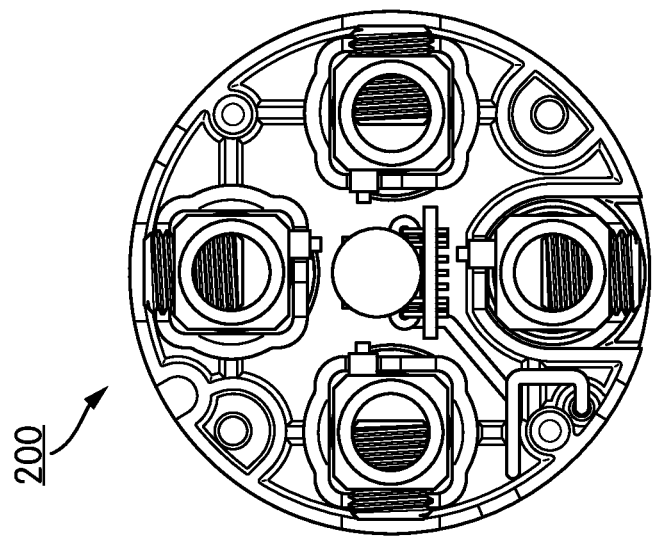
FIG. 7 is a top view of the contact carrier of FIG. 4 according to some embodiments of the application.
Figure 6:
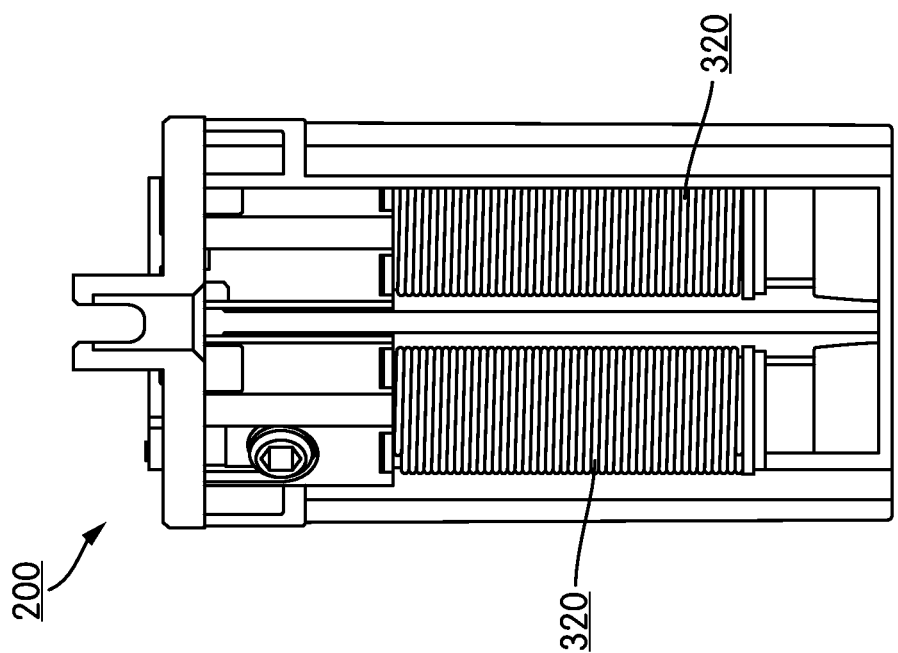
FIG. 6 is a cutaway view of the contact carrier of FIG. 4 according to some embodiments of the application.

FIG. 2 illustrates the connector 115 according to an embodiment of the application. The electrical power connector 115 is configured to provide an electrical connection between the power supply 105 and the load 110. The connector 115 may be configured to handle twenty-amps, thirty-amps, sixty-amps, one-hundred amps, etc. As illustrated, the connector 115 includes a contact carrier 200 and a sleeve connector 205. The contact carrier 200 includes one or more power terminals 210 located on a first end 215 of the contact carrier 200. Although not illustrated, the contact carrier 200 may further include one or more second power terminals located on a second end 220 of the contact carrier 200. Although illustrated as having four power terminals 210, the connector 115 may include any number of power terminals and second power terminals, for example one power terminal and one second power terminal, two power terminals and two second power terminals, three power terminals and three second power terminals, four power terminals and four second power terminals, five power terminals and five second power terminals, etc. In some embodiments, the power terminals 210 are electrically connected to the load 110 while the second power terminals are electrically connected to the power supply 105.

FIGS. 3-7 illustrate the contact carrier 200 according to some embodiments of the application. As illustrated in the exploded view of FIG. 3, the contact carrier 200 includes a shell 300, a cover 305, one or more connector contacts 310, one or more contact cores 315, one or more transformer windings 320, one or more sensors 325, and electronic assembly 330, and an antenna 335. The shell 300 is formed of a non-conductive material, such as but not limited to, a plastic material. The cover 305 is also formed of a nonconductive material, such as but not limited to, a plastic material. The shell 300, in conjunction with the cover 305, houses various components of the contact carrier 200. The one or more connector contacts 310 provide an electrical connection between the power terminals 210 and the second power terminals. The contact cores 315 are configured to receive the respective connector contacts 310. The contact cores 315 include transformer windings 320 integrated into the contact cores 315. The transformer windings 320 sense current travelling through the respective connector contacts 310. In some embodiments, a three-phase power supply may be monitored using two sets of transformer windings 320.

Figure 9:
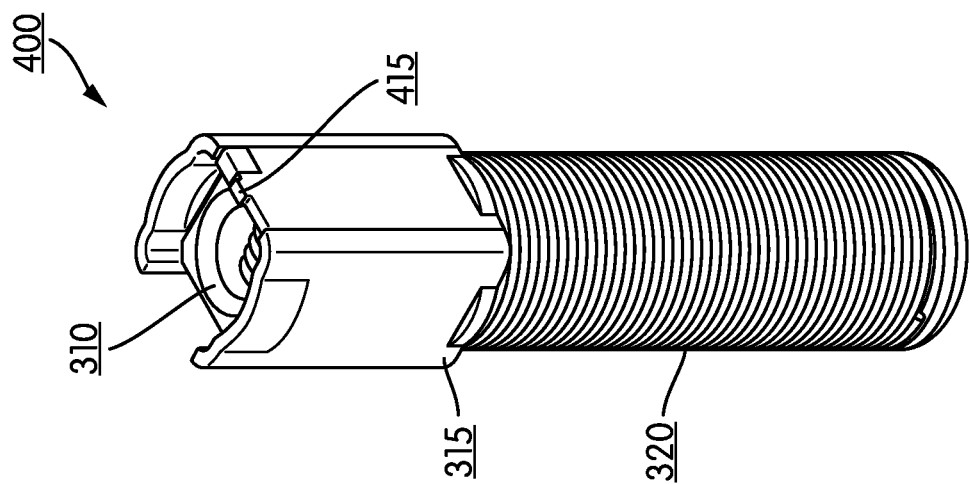
FIG. 9 is another perspective view of the contact transformer module of FIG. 8 according to some embodiments of the application.
Figure 8:
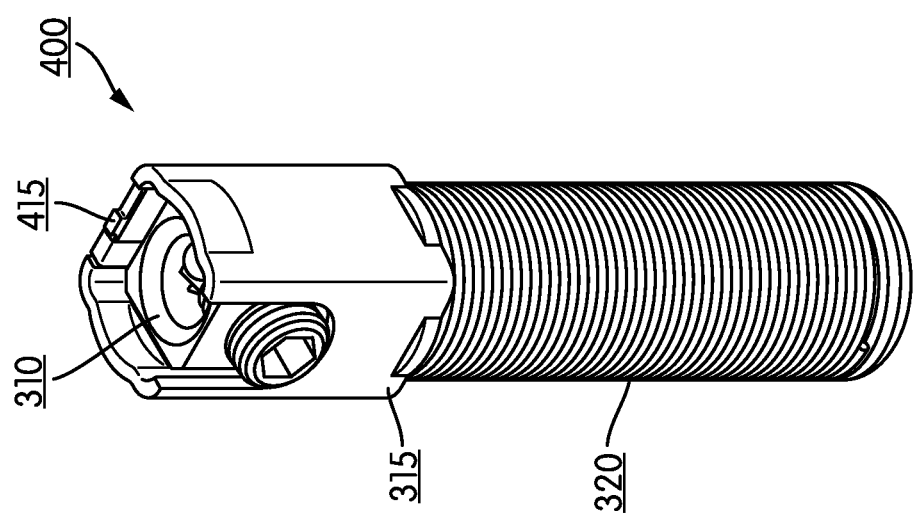
FIG. 8 is a perspective view of a contact transformer module of the contact carrier of FIG. 4 according to some embodiments of the application.
Figure 10:
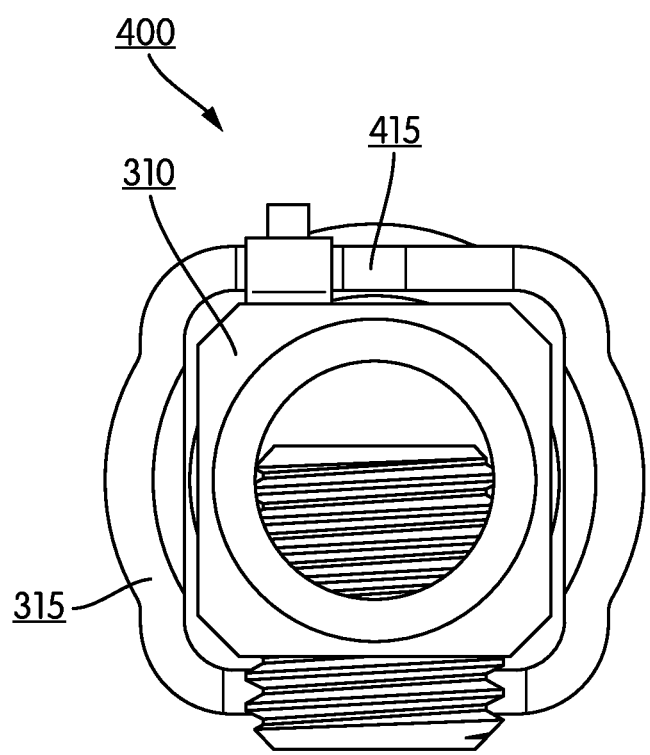
FIG. 10 is a top view of the contact transformer module of FIG. 8 according to some embodiments of the application.

FIGS. 8-10 illustrate a contact transformer (CT) module 400 including the contact 310, the contact core 315, and the transformer winding 320. As illustrated, the contact core 315 receives the respective contact 310. Additionally, as illustrated, the transformer winding 320 is integrated (e.g., wrapped around) the contact core 315. In some embodiments, the transformer windings 320 are a high turns-ratio linear windings wound around the respective cores 315. By spreading the transformer windings 320 along the length of the respective cores 315, current can be accurately sensed without exceeding the available geometry constraints of the contact carrier 200. The amount of CT modules 400 contacted within the shell 300 of the contact carrier 200 corresponds to the amount of power terminals of the contact carrier 200. In other embodiments, the transformer winding 320 may be a magnetic core winding having special geometry to fit around the core 315 and/or in the shell 300.

Figure 12:
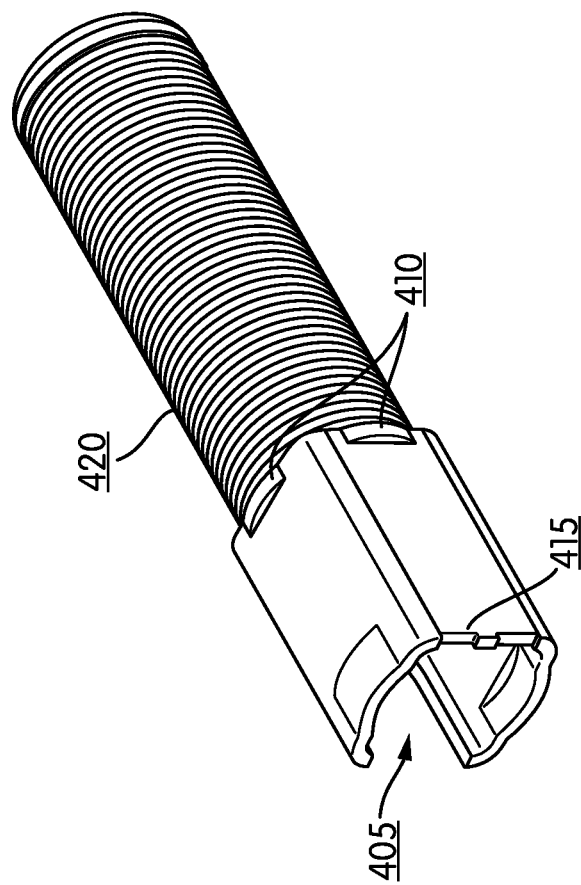
FIG. 12 is a side perspective view of the contact transformer module of FIG. 11 according to some embodiments of the application.
Figure 11:
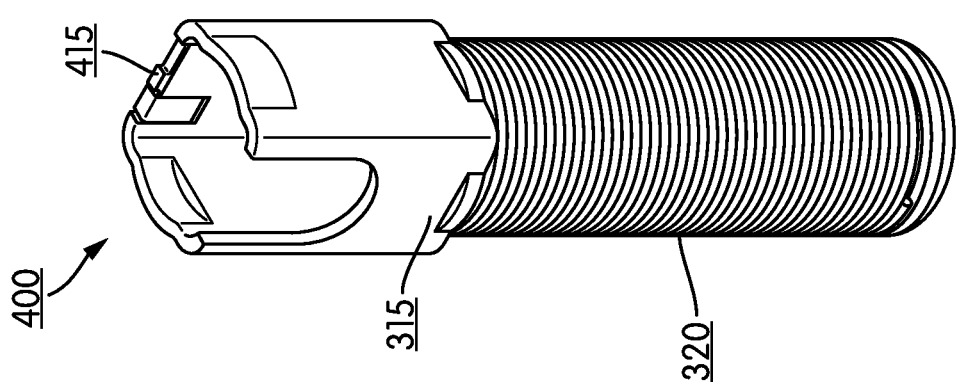
FIG. 11 is a perspective view of the contact transformer module of FIG. 8 without a contact, according to some embodiments of the application.

FIGS. 11 and 12 illustrate the CT module 400 without the contact 310. As illustrated, the CT module 400 further includes a contact opening 405 and wind guide ribs 410. The contact opening 405 is configured to receive the contact 310. The wind guide ribs 410 may be used to guide the transformer winding 320.

As illustrated in FIGS. 8-12, the CT module 400 further includes a sensor slot 415. The sensor slot 415 is configured to couple a respective sensor 325 to the CT module 400. In some embodiments, the one or more sensors 325 are configured to sense a voltage between the power supply 105 and the load 110 and/or a temperature of the contact 310. As illustrated, in some embodiments, the sensors 325 are clips configured to couple to the sensor slots 415 of the CT modules 400. In some embodiments, the sensors 325 thermistors, thermocouples, RTDs, or any similar sensor.

Figure 13:
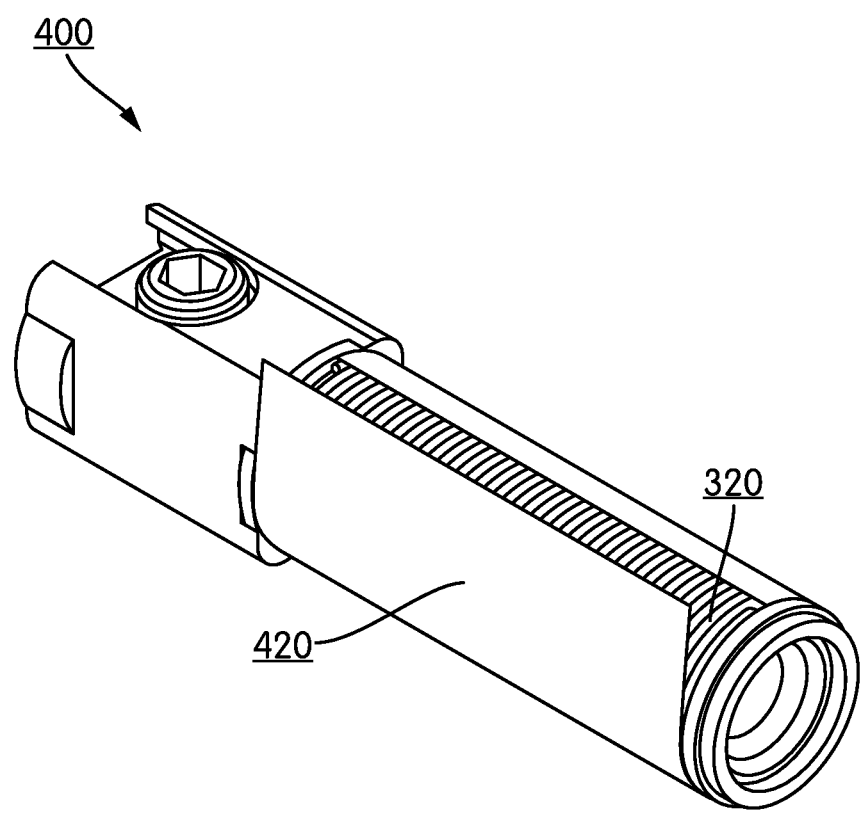
FIG. 13 is a perspective view of the contact transformer module of FIG. 8 including a shield, according to some embodiments of the application.

FIG. 13 illustrates the CT module 400 according to some embodiments of the application. In such an embodiment, the CT module 400 includes a shield 420. The shield 420 covers the transformer windings 320. In some embodiments, shielding the windings 320 improves current sensing.

Figure 15:
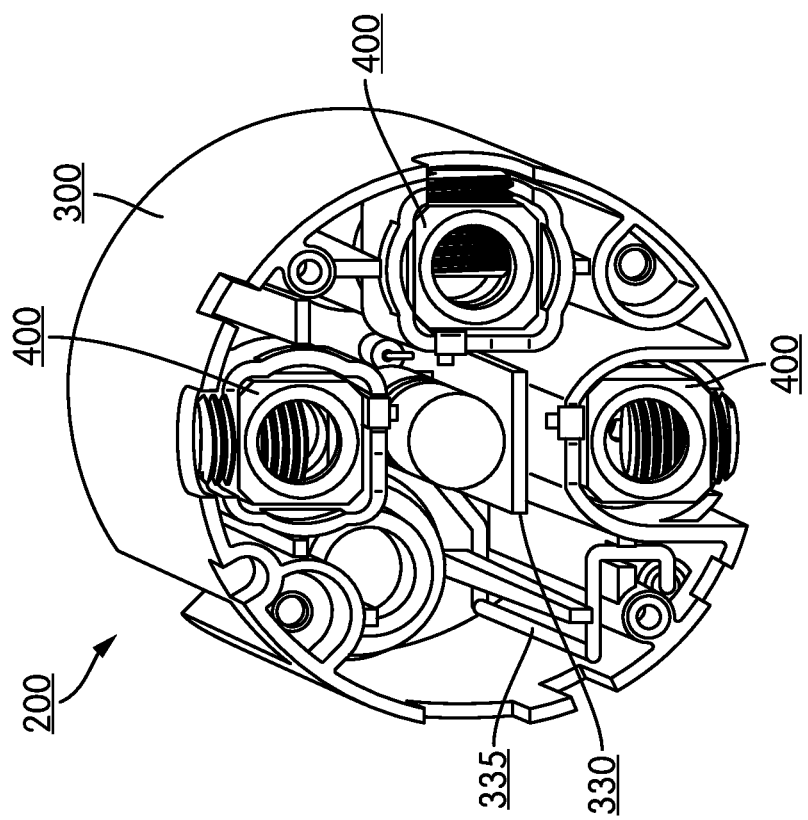
FIG. 15 is a front perspective view of the contact carrier of FIG. 4 without a cover, according to some embodiments of the application.
Figure 14:
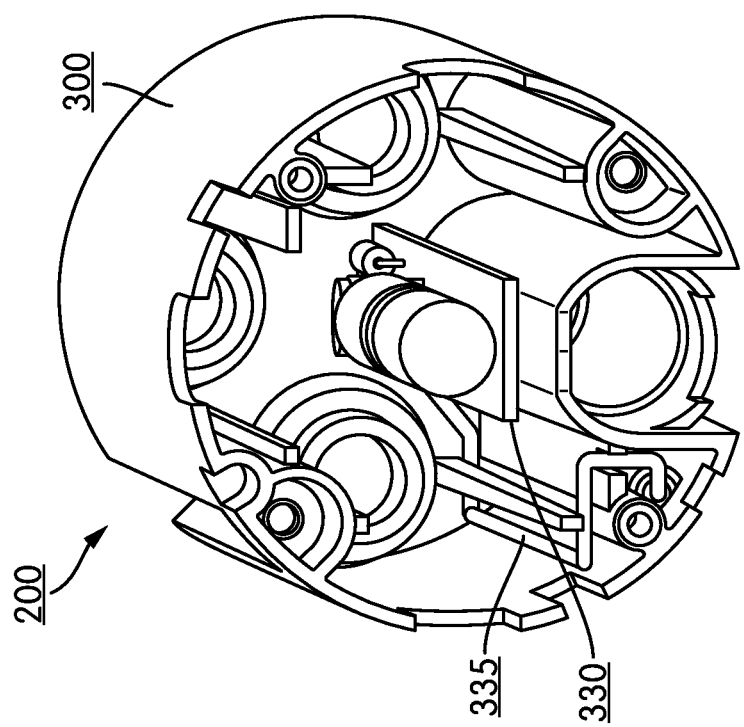
FIG. 14 is a front perspective view of the contact carrier of FIG. 4 without a cover, according to some embodiments of the application.

FIGS. 14 and 15 illustrate the electronic assembly 330 and antenna 335 contained within the shell 300 of the contact carrier 200. As illustrated, in some embodiments, the electronic assembly 330 and antenna 335 are located between the CT modules 400, and thus the contacts 310. Such a placement may eliminate interference while providing easy connection to the transformer windings 320 and sensors 325. In some embodiments, in addition to sensors 325, the electronics assembly 330 may include, or be connected to, additional sensors. In such an embodiment, the additional sensors may include an additional temperature sensor configured to sense a temperature central to the connector core. Also in such an embodiment, the additional sensors may sense the temperature of one or more various points of the contact carrier 200. Also in such an embodiment, the additional sensor may include an ambient sensor for sensing a temperature external the contact carrier 200.

In the illustrated embodiment, the antenna 335 is routed from the electronic assembly 330 along the outside wall of the shell 300. In some embodiments, the antenna 335 may be held in place by one or more slots in support ribs and/or holes adjacent the outside wall. The antenna 335 may be a dipole-type antenna, a loop-type antenna, a flat chip antenna, or any other known antenna. The antenna 335 is configured to wirelessly transmit various characteristics of the contact carrier 200. For example, the antenna 335 may wirelessly transmit current, voltage, and temperature of the contact carrier 200. In some embodiments, the characteristics are wirelessly transmitted to one or more external devices. In some embodiments, rather than, or in addition to, antenna 335, the contact carrier 200 may include an input/output port. In such an embodiment, the various characteristics described above may be transmitted via physical coupling.

Figure 16:
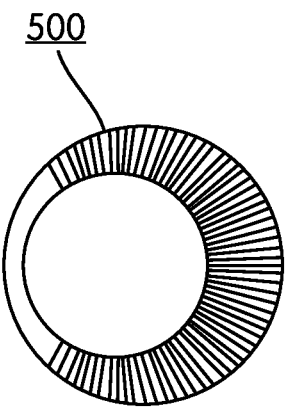
FIG. 16 is a top view of a transformer winding according to another embodiment of the application.
Figure 17:
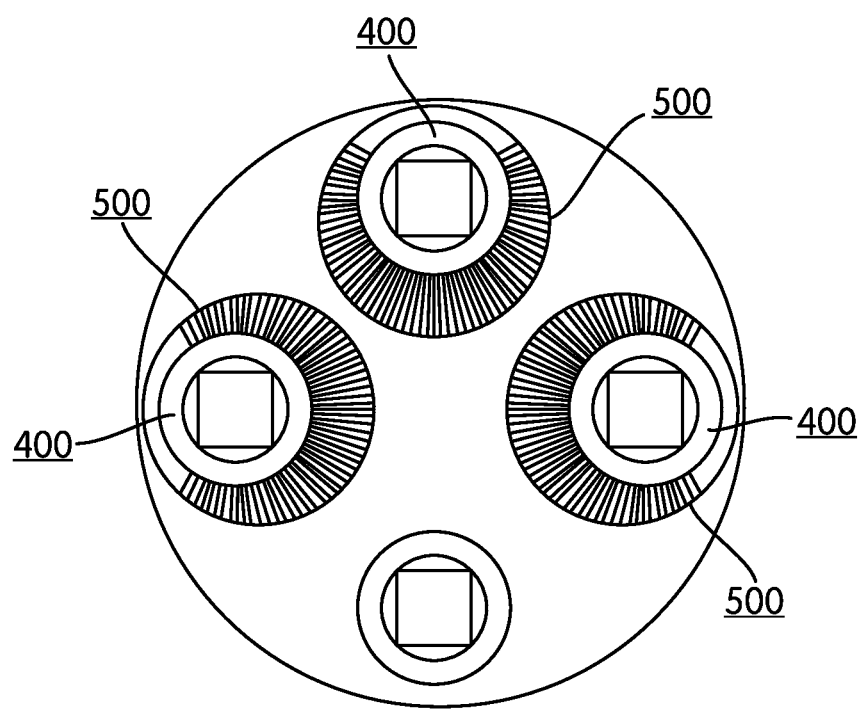
FIG. 17 is a top view of a contact carrier including the transformer of FIG. 17 according to an embodiment of the application.

FIGS. 16 and 17 illustrate biased transformer windings 500 according to another embodiment of the application. As illustrated, the biased transformer windings 500 may be integrated into, or around, the CT modules 400. In such an embodiment, the biased transformer windings 500 may be a Ragowski helical coil or a biased winding toroid. Such an embodiment may enable the placement of the CT modules 400 into geometries that are typically too small for a full transformer winding.

Thus, the application provides, among other things, an improved method and system for sensing various characteristics of an electronic power connector. Various features and advantages of the application are set forth in the following claims.

What is claimed is:

1. An electronic power connector comprising:
a contact configured to electrically connect a power supply to a load; and
a contact core configured to receive the contact, the contact core including a transformer winding wrapped around the contact core, the transformer winding configured to sense a current.

2. The electronic power connector of claim 1, further comprising a sleeve configured to cover the contact and the contact core.

3. The electronic power connector of claim 1, wherein the power supply is a single-phase power supply having a voltage of approximately 100 volts AC to approximately 240 volts AC.

4. The electronic power connector of claim 1, wherein the power supply has a voltage of at least one selected from the group consisting of approximately 24 volts direct current, approximately 48 volts direct current, and approximately 400 volts direct current.

5. The electronic power connector of claim 1, wherein the power supply is a three-phase power supply having a voltage of approximately 208 volts AC to approximately 600 volts AC.

6. The electronic power connector of claim 1, further comprising an antenna configured to transmit an electrical characteristic.

7. The electronic power connector of claim 1, wherein the electronic power connector further comprises a sensor.

8. The electronic power connector of claim 7, wherein the sensor is a voltage sensor.

9. The electronic power connector of claim 7, wherein the sensor is a temperature sensor.

10. The electronic power connector of claim 7, wherein the sensor slot is located at a first end of the contract core.

11. A power connector comprising:
a sleeve;
a contact carrier located within the sleeve, the contact carrier includes a contact transformer module having a transformer winding wrapped around a contact core.

12. The power connector of claim 11, wherein the transformer winding is configured to sense a current.

13. The power connector of claim 11, further comprising an antenna located within the sleeve, the antenna configured to transmit an electrical characteristic.

14. The power connector of claim 11, wherein the power supply has a voltage of at least one selected from the group consisting of approximately 24 volts direct current, approximately 48 volts direct current, and approximately 400 volts direct current.

15. The power connector of claim 11, wherein the contact transformer module further includes a sensor slot configure to receive a sensor.

16. The power connector of claim 15, wherein the sensor is a voltage sensor.

17. The power connector of claim 15, wherein the sensor is a temperature sensor.

18. A method of sensing various characteristics of an electronic power connector, the method comprising:
providing a transformer winding wrapped around a contact core;
sensing, via the transformer, a first characteristic; and
sensing, via a sensor, a second characteristic.

19. The method of claim 18, wherein the first characteristic is a current.

20. The method of claim 18, wherein the second characteristic is at least one selected from a group consisting of a voltage and a temperature.

* * * * *